(12) United States Patent
Schmidt et al.

(10) Patent No.: US 11,502,674 B2
(45) Date of Patent: *Nov. 15, 2022

(54) OPTIMIZED LOW RON FLATNESS GATE DRIVER

(71) Applicant: Texas Instruments Incorporated, Dallas, TX (US)

(72) Inventors: Thomas Alan Schmidt, Plano, TX (US); Vikas Suma Vinay, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/356,479

(22) Filed: Jun. 23, 2021

(65) Prior Publication Data

US 2022/0021381 A1    Jan. 20, 2022

Related U.S. Application Data

(60) Provisional application No. 63/053,879, filed on Jul. 20, 2020.

(51) Int. Cl.
  *H03K 17/687*    (2006.01)
  *H03K 17/06*    (2006.01)

(52) U.S. Cl.
  CPC ....... *H03K 17/063* (2013.01); *H03K 17/6872* (2013.01); *H03K 2017/6878* (2013.01)

(58) Field of Classification Search
  CPC combination set(s) only.
  See application file for complete search history.

(56) References Cited

U.S. PATENT DOCUMENTS

| | | | |
|---|---|---|---|
| 5,966,030 A | 10/1999 | Schmitt et al. | |
| 10,256,802 B1 | 4/2019 | Vaz | |
| 10,520,971 B2 * | 12/2019 | Easwaran | H03K 17/0822 |
| 2004/0233604 A1 | 11/2004 | Beck et al. | |
| 2006/0132173 A1 | 6/2006 | Dover et al. | |

(Continued)

FOREIGN PATENT DOCUMENTS

| | | |
|---|---|---|
| DE | 19930036 | 1/2001 |
| KR | 20080046081 | 5/2008 |

OTHER PUBLICATIONS

International Search Report in corresponding PCT Application No. PCT/US2019/031413, dated Aug. 22, 2019 (2 pages).

*Primary Examiner* — Long Nguyen
(74) *Attorney, Agent, or Firm* — Mark A. Valetti; Charles A. Brill; Frank D. Cimino (57) ABSTRACT

An analog switch includes a first field effect transistor (FET) which has a first terminal coupled to an input voltage terminal, a second terminal coupled to a common source, and a control terminal coupled to a common gate. The switch includes a second FET which has a first terminal coupled to an output voltage terminal, a second terminal coupled to the common source, and a control terminal coupled to the common gate. The switch includes a switched current source which has an input coupled to a high voltage supply terminal and an output coupled to the common gate. The switch includes a clamp circuit which has a first terminal coupled to the common gate, a second terminal coupled to the common source, and a third terminal coupled to the low voltage supply terminal.

19 Claims, 4 Drawing Sheets

(56) References Cited

U.S. PATENT DOCUMENTS

| | | |
|---|---|---|
| 2014/0021979 A1 | 1/2014 | Huang |
| 2017/0033556 A1 | 2/2017 | Tornila Oliver et al. |
| 2017/0063074 A1 | 3/2017 | Yasusaka et al. |
| 2017/0346274 A1 | 11/2017 | Nakahara et al. |
| 2022/0021380 A1* | 1/2022 | Schmidt ........... H03K 17/04123 |

* cited by examiner

OPTIMIZED LOW RON FLATNESS GATE DRIVER

CROSS REFERENCE TO RELATED APPLICATION

This application claims priority to U.S. Provisional Application No. 63/053,879, filed Jul. 20, 2020, entitled "Optimized Low Ron Flatness Gate", which is hereby incorporated by reference in its entirety.

TECHNICAL FIELD

This description relates generally to analog switches.

BACKGROUND

Analog signal switches are used to aggregate inputs and outputs from multiple sources into a signal chain for processing. For example, in a commercial HVAC system, input signals from several temperature sensors may be multiplexed via an analog switch into a single amplifier or an analog-to-digital (A/D) converter.

A drawback of existing analog switches is that they introduce errors to a signal chain. Due to a change in a gate-to-source voltage (Vgs) applied to bias the analog switches, the on-resistance Ron of the switches vary, which introduces error into the signal chain.

SUMMARY

In one aspect, a switch includes a first field effect transistor (FET) which has a first terminal coupled to an input voltage terminal, a second terminal coupled to a common source, and a control terminal coupled to a common gate. The switch includes a second FET which has a first terminal coupled to an output voltage terminal, a second terminal coupled to the common source, and a control terminal coupled to the common gate. The switch includes a switched current source which has an input coupled to a high voltage supply terminal and an output coupled to the common gate. The switched current source supplies a gate current to the common gate. The switch includes a third FET coupled between the common gate and a low voltage supply terminal. The third FET connects the common gate to the low voltage supply terminal when the third FET is turned on and disconnects the common gate from the low voltage supply terminal when the third FET is turned off. The switch includes a fourth FET coupled between the common source and the low voltage supply terminal. The fourth FET connects the common source to the low voltage supply terminal when the fourth FET is turned on and disconnects the common source terminal from the low voltage supply terminal when the fourth FET is turned off. The switch includes a clamp circuit which has a first terminal coupled to the common gate, a second terminal coupled to the common source, and a third terminal adapted to be coupled to the low voltage supply terminal. The clamp circuit clamps the voltage across the common gate and the common source to prevent damage to the first and second FETs and to bias the FETs.

In an additional aspect, the clamp circuit includes an NFET which has a drain coupled to the common gate, a gate coupled to the drain, and a source. The clamp circuit includes a source follower p-channel field effect transistor (PFET) which has a source coupled to the source of the third NFET, a gate coupled to the common source, and a drain coupled to the low voltage terminal.

In an additional aspect, the switched current source includes a first current mirror which has a first terminal coupled to receive an input current and a second terminal coupled to the low voltage terminal. The first current mirror provides a first mirrored current. The switched current source includes a second current mirror which has a first terminal coupled to the high voltage terminal and a second terminal coupled to receive the first mirrored current. The second current mirror supplies the gate current to the common gate. The switched current source includes an NFET which has a source coupled to the first current mirror, a drain coupled to the second current mirror, and a gate adapted to be coupled tor receive an enable signal. The NFET couples the first current mirror to the second mirror responsive to the enable signal.

In an additional aspect, a switch includes a first n-channel field effect transistor (NFET) which has a drain coupled to an input voltage terminal, a source coupled to a common source, and a gate coupled to a common gate. The switch includes a second NFET which has a drain coupled to an output voltage terminal, a source coupled to the common source, and a gate coupled to the common gate. The switch includes a switched current source which has an input coupled to a high voltage supply terminal and an output coupled to the common gate. The switched current source supplies a gate current to the common gate. The switch includes a third NFET which has a drain coupled to the common gate, a source coupled to a low voltage supply terminal, and a gate adapted to be coupled to receive a disable signal. The third NFET connects the common gate to the low voltage supply terminal responsive to receiving the disable signal and disconnects the common gate from the low voltage supply terminal when the disable signal is removed. The switch includes a fourth NFET which has a drain coupled to the common source, a source coupled to the low voltage supply terminal, and a gate coupled to receive the disable signal. The fourth NFET connects the common source to the low voltage supply terminal responsive to receiving the disable signal and disconnects the common source from the low voltage supply terminal when the disable signal is removed. The switch includes a clamp circuit which has a first terminal coupled to the common gate, a second terminal coupled to the common source, and a third terminal adapted to be coupled to the low voltage supply terminal. The clamp circuit clamps the voltage across the common gate and the common source.

In an additional aspect, the switched current source includes a fifth NFET which has a drain adapted to be coupled to receive an input current, a source coupled to the low voltage supply terminal, and a gate coupled to the drain. The switched current source includes a sixth NFET which has a drain, a source coupled to the low voltage supply terminal, and a gate coupled to the gate of the fifth NFET. The sixth NFET mirrors the input current.

In an additional aspect, the switched current source includes a first p-channel field effect transistor (PFET) which has a source coupled to the high voltage supply terminal, a drain, and a gate coupled to the drain. The switched current source includes a second PFET which has a source coupled to the high voltage supply terminal, a drain coupled to the common gate, and a gate coupled to the gate of the first PFET. The second PFET mirrors current through the first PFET and supplies the gate current to the common gate. The switched current source includes a seventh NFET which has a drain coupled to the drain of the first PFET, a source coupled to the drain of the sixth NFET, and a gate adapted to be coupled to receive an enable signal. The seventh NFET couples the sixth NFET to the first PFET responsive to the enable signal.

In an additional aspect, the clamp circuit includes an eighth NFET which has a drain coupled to the common gate, a gate coupled to the drain, and a source. The clamp circuit includes a source follower PFET which has a source coupled to the source of the eighth NFET, a gate coupled to the common source, and a drain coupled to the low voltage terminal.

BRIEF DESCRIPTION OF THE DRAWINGS

The same reference numbers or other reference designators are used in the drawings to designate the same of similar (functionally and/or structurally) features.

DETAILED DESCRIPTION

Figure 1:
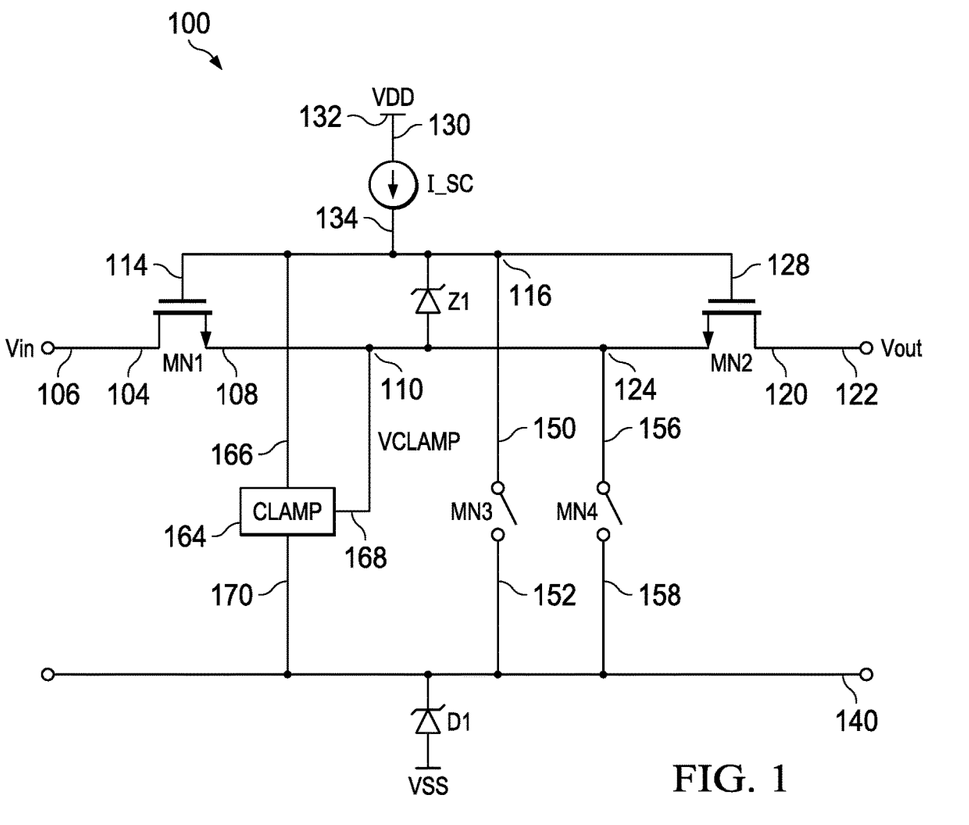
FIG. 1 is a block diagram of an analog switch of an example embodiment.

FIG. 1 is a block diagram of an analog switch 100 of an example embodiment. The analog switch 100 can be used, for example, to aggregate inputs and outputs from multiple sources into a signal chain or to multiplex inputs from multiple sources. The switch 100 includes a clamp circuit CLAMP 164 which tracks an input voltage Vin. The input voltage Vin is used as a reference to generate a floating gate to source voltage. The floating gate to source voltage, which is also referred to as a clamp voltage VCLAMP, is applied between a common gate and a common source of the switch 100 to bias the switch 100. The clamp circuit CLAMP 164 increases the range of an on-resistance Ron flatness of the switch 100 while biasing the switch 100 with a low gate to source voltage. An advantage of biasing the switch 100 with a low gate to source voltage is that a charge pump is not required to turn on the switch 100, which reduces die area required to fabricate the switch 100 in a semiconductor integrated circuit (IC) (e.g. switch 100 can be implemented on a single semiconductor die).

The switch 100 includes a first FET MN1 which has a first terminal 104 (e.g. a drain) coupled to an input voltage terminal 106, and a second terminal 108 (e.g. a source) coupled to a first common terminal 110 (referred to as the common source 110). The FET MN1 has a control terminal 114 (e.g. a gate) which is coupled to a second common terminal 116 (referred to as the common gate 116). The switch 100 includes a second FET MN2 which has a first terminal 120 (e.g. a drain) adapted to be coupled to an output voltage terminal 122, and has a second terminal 124 (e.g. a source) coupled to the common source 110. The FET MN2 has a control terminal 128 (e.g. a gate) which is coupled to the common gate 116. In an example embodiment, MN1 and MN2 are high voltage FETs which are coupled back to back (e.g. the sources of FETs MN1 and MN2 are coupled together).

The switch 100 includes a switched current source I_SC which has an input 130 coupled to a voltage supply terminal 132, and an output 134 coupled to the common gate 116. The switched current source I_SC supplies a gate current (e.g. having a magnitude of I_SC that is approximately 55 uA) to the common gate 116 to turn on/off the FETs MN1 and MN2. An advantage of the switched current source I_SC is that it allows lower off current when the switch 100 is in an off state. In other embodiments, a constant current source may be used instead of the switched current source I_SC. The high voltage supply terminal 132 can be coupled to a high voltage supply VDD (e.g., approximately 24V). The high voltage supply terminal 132 may be a voltage supply that supplies a voltage that is higher than the oxide breakdown voltage of MN1 and MN2.

The switch 100 includes a third FET MN3 coupled between the common gate 116 and a low voltage supply terminal 140. The FET MN3 couples the common gate 116 to the low voltage supply terminal 140 when MN3 is turned on (i.e., closed) and disconnects the common gate 116 from the low voltage supply terminal 140 when MN3 is turned off (i.e., opened). The low voltage supply terminal 140 can be coupled to a low voltage supply VSS (e.g., ground or approximately −24V) via a diode D1 (e.g. a Schottky diode).

The switch 100 includes a fourth FET MN4 coupled between the common source 110 and the low voltage supply terminal 140. The FET MN4 couples the common source 110 to the low voltage supply terminal 140 when MN4 is turned on (i.e., closed) and disconnects the common source 110 from the low voltage supply terminal 140 when MN4 is turned off (i.e., opened).

In an example embodiment, MN1 is an n-channel metal-oxide-silicon field effect transistor (NFET) which has a drain (104), a source (108), and a gate (114), and MN2 is an NFET which has a drain (120), a source (124), and a gate (128). The sources 108 and 124 are coupled to form the common source 110, and the gates 114 and 128 are coupled to form the common gate 116. The input voltage terminal 106 can be coupled to an input voltage Vin, the high voltage terminal 132 can be coupled to a high voltage supply VDD, and the low voltage terminal 140 can be coupled to a low voltage supply VSS. The switch 100 provides an output voltage Vout at the output terminal 122.

The switch 100 includes a clamp circuit 164 which has a first terminal 166 coupled to the common gate 116, a second terminal 168 coupled to the common source 110, and a third terminal 170 adapted to be coupled to the low voltage supply terminal 140. The clamp circuit 164 applies a clamp voltage VCLAMP across the common gate 116 and the common source 110. As explained below, the clamp voltage VCLAMP biases MN1 and MN2 and protects MN1 and MN2 from being damaged. In an example embodiment, VCLAMP is set at a level sufficient (e.g., less than 3.0V or 2.5V) to bias Vgs (the gate-to-source voltage) of MN1 and MN2 and within a safe operating voltage range of MN1 and MN2.

Figure 2:
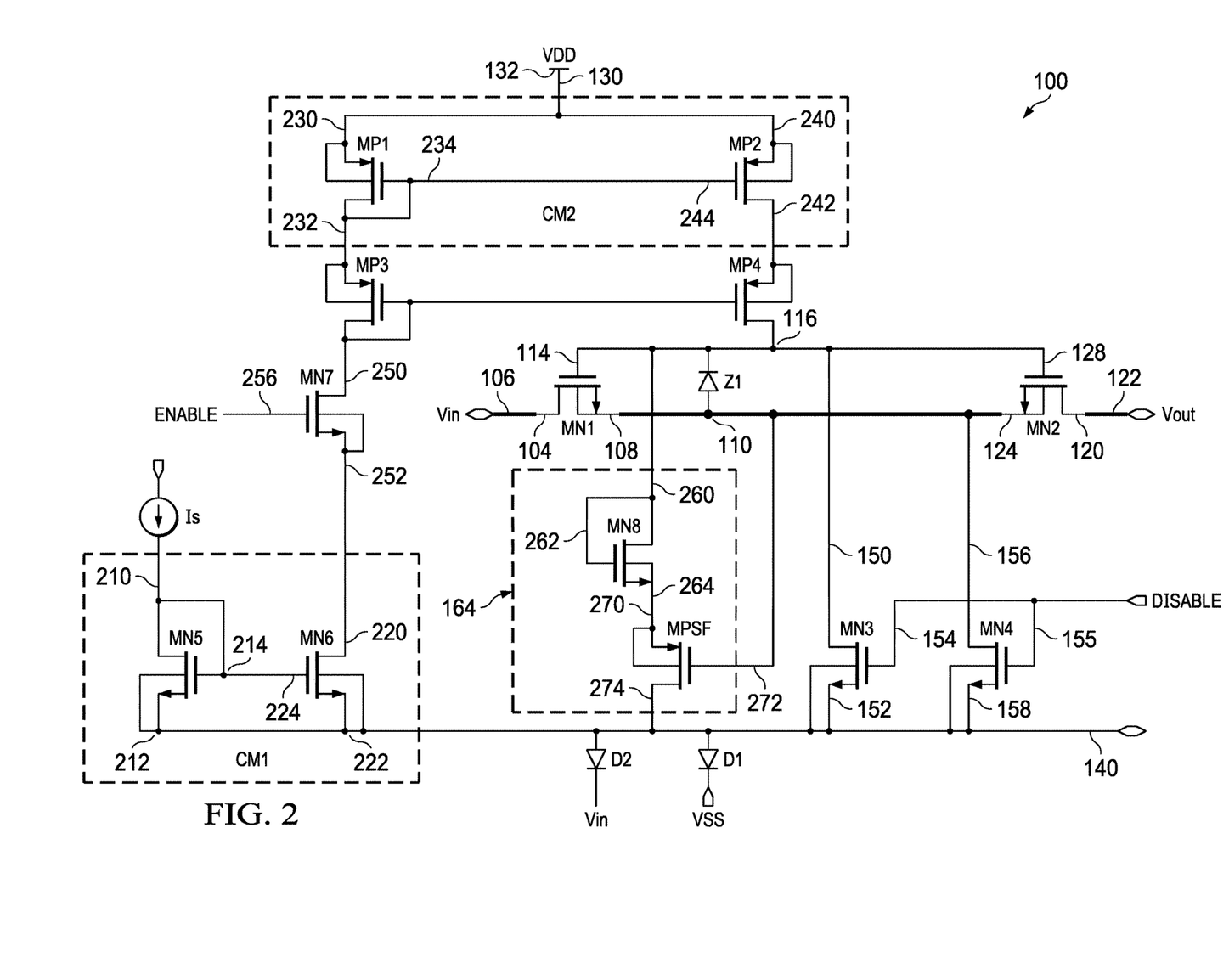
FIG. 2 is a schematic diagram of an analog switch of an example embodiment.

FIG. 2 is a schematic diagram of the switch 100 of an example embodiment. The switch 100 includes the NFET MN1 which has the drain 104, the source 108, and the gate 114. The switch 100 includes the NFET MN2 which has the drain 122, the source 124, and the gate 128. The sources 108 and 124 are coupled to form the common source 110, and the gates 114 and 128 are coupled to form the common gate 116.

The switch 100 includes the NFET MN3 which has the drain 150 coupled to the common gate 116 and has the source 152 coupled to the low voltage terminal 140. The switch 100 includes the NFET MN4 which has the drain 156 coupled to the common source 110 and has the source 158 coupled to the low voltage terminal 140. The FETs MN3 and MN4 have respective gates 154 and 155 coupled to receive a disable signal DISABLE. In an example embodiment illustrated in FIG. 2, the backgates of transistors MN3 and MN4 are connected to the low voltage supply terminal 140.

In an example embodiment, the low voltage supply terminal 140 is coupled to the low voltage supply VSS via a diode D1 and, in some example embodiments, also coupled to the input voltage Vin via a diode D2. The diodes D1 and D2 jointly function as a "Diode OR" which sets the anode of D1 and D2 at a voltage level equal to the lower of Vin or VSS. The effect of this is the switch 100 can be turned off when VSS>Vin and also when Vin<VSS by pulling the common source 110 to the lower of Vin and VSS and prevent body diodes (not shown in FIG. 2) from Vin to VSS from conducting.

In an example embodiment, the switched current source I_SC is implemented with first and second current mirrors CM1 and CM2 that are coupled together by a FET MN7 to turn on the switch 100. The first current mirror CM1 includes a fifth NFET MN5 which has a drain 210 adapted to be coupled to receive an input current Is, and has a source 212 coupled to the low voltage supply terminal 140. The NFET MN5 has a gate 214 coupled to the drain 210. The first current mirror CM1 includes a sixth NFET MN6 which has a drain 220, a source 222 coupled to the low voltage supply terminal 140, and a gate 224 coupled to the gate 214 of MN4. The sixth NFET MN6 mirrors the input current Is which flows through MN5.

The second current mirror CM2 includes a first p-channel metal-oxide-semiconductor field effect transistor (PFET) MP1 which has a source 230 coupled to the high voltage supply terminal 130, a drain 232, and a gate 234 coupled to the drain 232. The second current mirror CM2 includes a second PFET MP2 which has a source 240 coupled to the high voltage supply terminal 130, a drain 242 coupled to the common gate 116, and a gate 244 coupled to the gate 234 of the PFET MP1. The second PFET MP2 mirrors current through the first PFET MP1 and supplies the gate current to the common gate 116 via the current mirror formed by transistors MP3 and MP4.

The switched current source I_SC includes the seventh NFET MN7 which has a drain 250 coupled to the drain 232 of the first PFET MP1, and a source 252 coupled to the drain 220 of the sixth NFET MN6. The seventh NFET MN7 has a gate 256 coupled to receive an enable signal ENABLE. In response to the enable signal ENABLE, the NFET MN7 couples the sixth NFET MN6 to the first PFET MP1.

In some implementations, in order to protect MP2 by preventing a voltage VDD-VSS from being applied to MP2, a pair of PFETs MP3 and MP4 is utilized to couple the second current mirror CM2 to the common gate 116. The PFET MP4 is coupled between the PFET MP2 and the common gate 116, and the PFET MP3 is coupled between the PFET MP1 and the NFET MN7. Thus, the second current mirror CM2 is electrically connected to the common gate 116 via the PFET MP4, and the second current mirror CM2 is electrically connected to the first current mirror CM1 via the PFET MP3 and the NFET MN7.

Because the gates 214 and 224 of MN5 and MN6 are interconnected and the sources 212 and 222 of MN5 and MN6 are interconnected, the current through MN5 is mirrored by MN6. When MN7 is tuned on by applying the enable signal ENABLE, the drain 232 of MP1 is coupled to the drain 220 of MN6, and as a result, current through MP1 flows through MN6. Because the gates 234 and 244 of MP1 and MP2 are interconnected and the sources 230 and 240 of MP1 and MP2 are interconnected, the current through MP1 is mirrored by MP2.

In an example embodiment, MN5 and MN6 are sized so that the input current through MN5 is mirrored by MN6 by a factor of 10. Thus, if the input current through MN5, for example, is 1 uA, the current through MN6 is approximately 10 uA. Since the current through MN6 is approximately equal to the current through MP1, 10 uA current also flows through MP1. In an example embodiment, MP1 and MP2 are sized so that the current through MP1 is mirrored by a factor of 5 by MP2. Thus, if the current through MP1 is 10 uA, the current through MP2 is approximately 50 uA. The effect of this is that 50 uA gate current supplied to the common gate 116 by MP4.

In an example embodiment, the clamp circuit 164 includes an NFET MN8 which has a drain 260 coupled to the common gate 116, and a gate 262 coupled to the drain 260. The NFET MN8 has a source 264. The clamp circuit 164 includes a source follower PFET MPSF which has a source 270 coupled to the source 264 of the FET MN8, and a gate 272 coupled to the common source 110. The source follower PFET MPSF has a drain 274 coupled to the low voltage terminal 140.

Consider, for example, 50 uA gate current is supplied to the common gate 116. Thus the gate to source voltages (Vgs) of MN1 and MN2 begin to rise. When Vgs rises above a threshold Vt, e.g. MN1 and MN2 are in the Miller region), MN1 and MN2 conduct, causing the input voltage Vin to appear at the common source 110 and at Vout 122. As MN1 and MN2 conduct and enter the Rds enhancement region, the voltage at the common gate 116 rises again until the PFET MPSF is turned on. The effect of this is that the clamp circuit 164 clamps the voltage between the common gate 116 and the common source 110 to VCLAMP and prevents further rise of the voltage at the common gate 116. The clamp voltage VCLAMP is set at a level lower than a secondary over-voltage protection limit (e.g., 6.5V), but higher than the threshold voltage Vt necessary to allow MN1 and MN2 to conduct. By clamping the voltage between the common gate 116 and the common source 110 at VCLAMP, the clamp circuit 164 prevents damage to the FETs MN1 and MN2 and also biases the FETs MN1 and MN2 so they can conduct. In an example embodiment, VCLAMP is set less than 3.0V (e.g., approximately 2.5V).

A Zener diode D1 is connected between the common source 110 and the common gate 116. The Zener diode D1 has an anode connected to the common source 110 and has a cathode connected to the common gate 116. The Zener diode Z1 provides the secondary over-voltage protection in both the positive direction when the switch 100 is turned on and also in the negative direction (source to gate) when MN3 and MN4 turn-on when the switch 100 is disabled (i.e., MN1 and MN2 are turned off).

In order to apply the input signal Vin from the input terminal 106 to the output terminal 120, the disable signal DISABLE is removed from the gates 154 and 156 of MN3 and MN4. As a result, the common gate 116 and the common source 110 are released from the low voltage terminal 140. At the same time, the enable signal ENABLE is applied to the gate 256 of MN7, thus coupling the first current mirror CM1 to the second current mirror CM2. When the gate current is supplied to the common gate 116, the voltage at the common gate 116 rises, thus turning on the NFETs MN1 and MN2. As a result, the input voltage Vin is coupled to the common source 110 and Vout 122. Because the gate 272 of the source follower PFET MPSF is coupled to the common source 110, as the voltage at the common source 110 rises above a threshold voltage required to turn on the source follower PFET MPSF, the source follower MPSF conducts. Thus, the voltage at the source 270 of the source follower MPSF rises to Vgs (i.e., voltage across the gate and the source of MPSF) above the common source 110. Because the gate 262 of the NFET MN8 is coupled to the drain 260, the NFET MN8 conducts. The effect of this is the voltage across the common gate 116 and the common source 110 is approximately the sum of the voltage across the NFET MN8 (i.e., voltage between the shorted drain/gate and the source of MN8, sometimes referred to as a diode connected NFET) and Vgs of the source follower MPSF. By selecting MN8 and the source follower MPSF, the voltage across the common gate 116 and the common gate 110 is set at a desired level. In an example embodiment, the voltage across the common gate 116 and the common source is set at approximately 2.5V, by sizing the width and the length of MN8 and MPSF, which is significantly lower than the secondary over-voltage protection (e.g., 6.5V) provided by the Zener diode Z1 but adequate to bias the NFETs MN1 and MN2 to conduct. Thus, the clamp circuit 164 clamps the voltage across the common gate 116 and the common source 110 at a level to prevent the NFETs MN1 and MN2 from being damaged while biasing MN1 and MN2 so they can conduct.

Figure 3A:
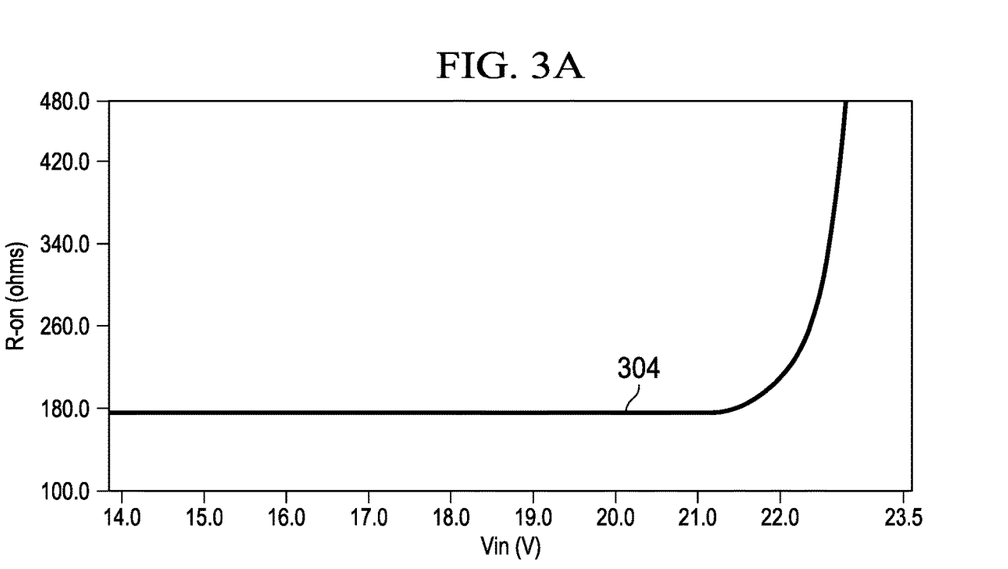
FIGS. 3A-3B and 4 illustrate simulated waveforms in an analog switch of an example embodiment.
Figure 3B:
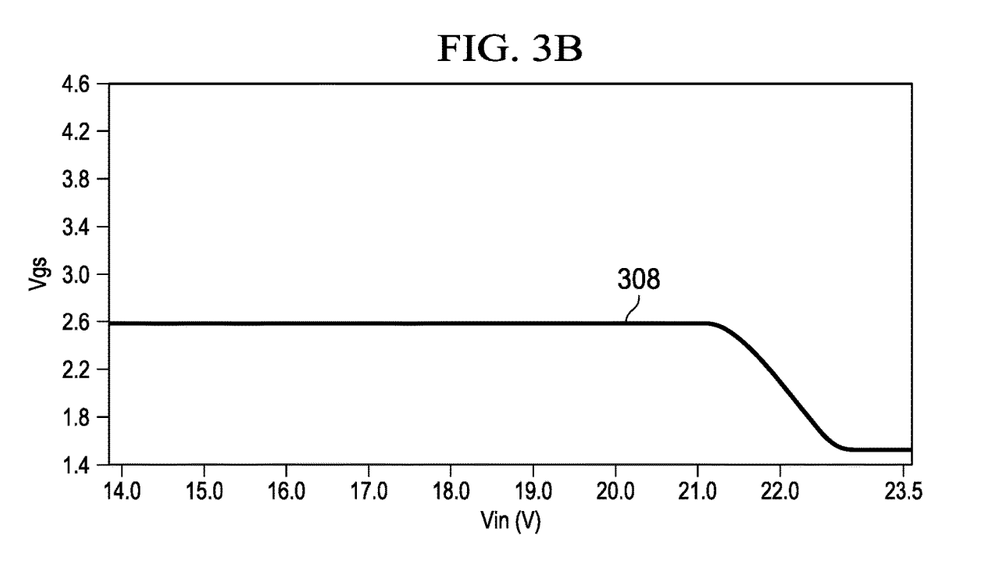

In an example embodiment, the NFETs MN1 and MN2 are biased at approximately 2.5V by VCLAMP in contrast to being biased at, for example, 5V. As a result, the on-resistance Ron, which is defined as the equivalent resistance between the input terminal 106 and the output terminal 122, exhibits a flat response over a wider range of input voltage. FIGS. 3A-3B illustrate simulated waveform 304 representing R-on versus Vin and simulated waveform 308 representing Vgs versus Vin. In FIG. 3A, the x-axis represents input voltage Vin (volts) and the y-axis represents Ron (ohms). As Vin rises from 14V to approximately 21V, Ron remains flat, thus exhibiting flatness over a wide Vin range. Ron starts to rise when Vin reaches approximately VDD-3V.

In FIG. 3B, the x-axis represents input voltage Vin and the y-axis represents the gate-to-source voltage Vgs. As Vin rises to 21V, Vgs remains flat, thus providing a stable bias voltage to the FETs MN1 and MN2 over a wide Vin range. Thus, the clamp circuit 164 provides a stable clamp voltage across the common gate 116 and the common source 110 over a wide Vin range.

Figure 4:
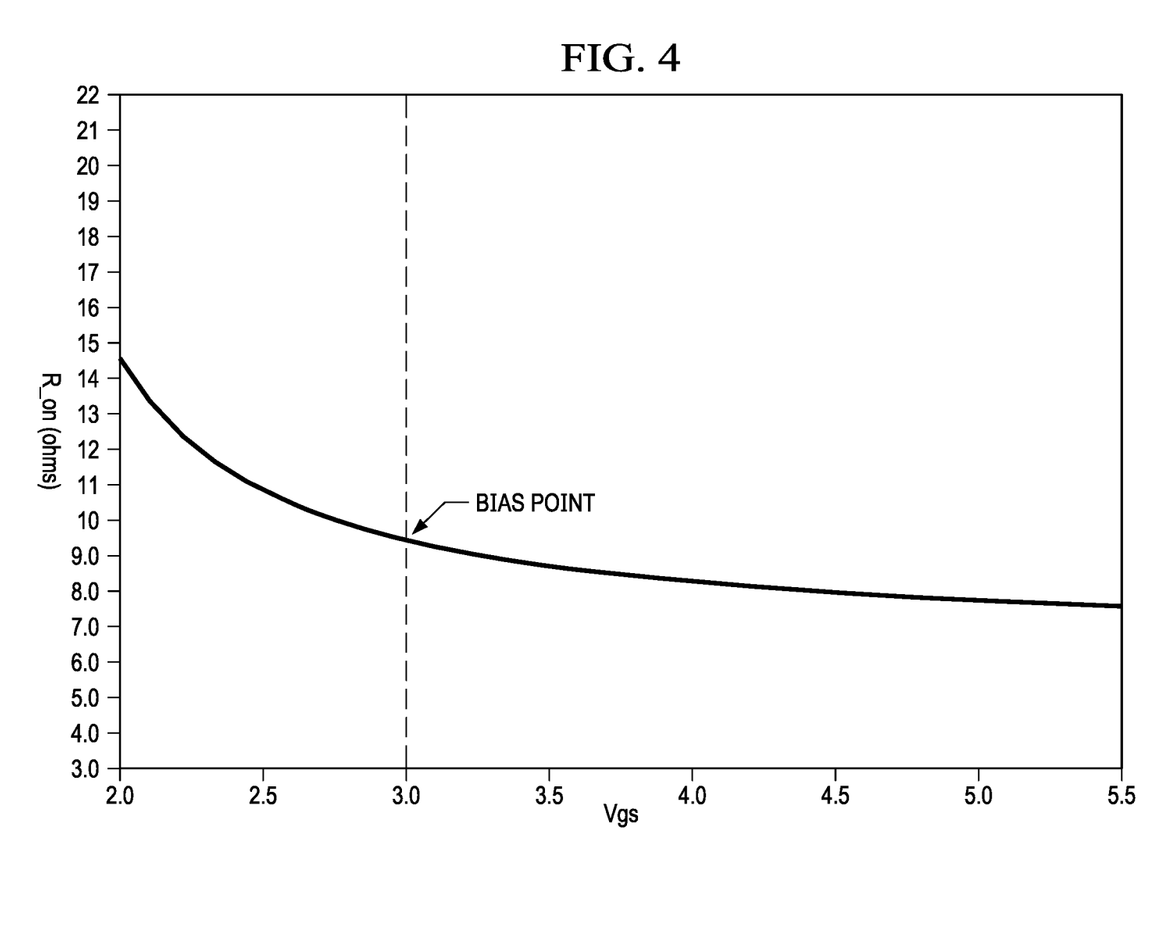

FIG. 4 illustrates a simulated waveform of Ron vs. Vgs. The x-axis represents Vgs (volts) and the y-axis represents Ron (ohms). In one aspect, a lower Vgs (e.g., 3.0V) is chosen to bias the switch 100. In the example of FIG. 4, the bias point is at around 3V. The effect of this is that Ron flatness is significantly improved over a wider input voltage range but Ron value is increased by approximately 10% to 20%. In analog applications requiring high precision across a wide range of input signal, it is generally more desirable to maintain a flat Ron across the range of input signal than having a lower Ron. By improving Ron flatness, less error is introduced into the signal chain due to variation in Ron. The increased Ron value due to low Vgs biasing can be compensated by increasing the area of the switch by around 10%. The choice between slightly degraded Ron performance or switch area is determined by the performance and cost constraints of the application.

In one aspect, the PMOS source follower MPSF tracks the input voltage Vin, and in response generates a constant Vgs (i.e., VCAMP) as the sum of gate to source voltage (Vgs) of MPSF and drain to source voltage Vds of MN8. The voltage VCLAMP is applied between the common gate 116 and the common source 110. Using a constant VCLAMP over the entire range of Vin results in an accurate and a linear Ron over the entire operating range.

In another aspect, the FET MN8 is chosen having identical properties to MN1 and MN2. By matching MN8 with MN1 and MN2, process related errors resulting from changes in Vt (threshold voltage) are reduced. Furthermore, the back to back coupled MN1 and MN2 provide a safe operation in the event VDD and VSS are not present (i.e., 0 or floating). When Vin is applied, the output 122 remains isolated and there are no leakage paths to either VDD or VSS. Consider that VDD and VSS are not applied and Vin>VDD. In this case, the signal at the input 106 is not passed to the output 122 or to VDD because the body diode of MN1 acts as a reverse blocking diode. Now consider that VDD and VSS are not applied and Vin<VSS. In this case, the body diode of MN1 is forward biased but the body diode of MN2 is reverse biased, thereby blocking the signal at the input 106 from reaching the output 122.

Variations to the switch 100 within the scope of the disclosure are possible. For example, the clamp circuit 164 may utilize a variable resistor instead of the NFET MN8. If a variable resistor is utilized, the clamp voltage across the common gate 116 and the common source 110 is the sum of the voltage across the variable resistor and Vgs of the source follower MPSF. Also, a diode or multiple series coupled diodes, Vbe multiplier, or Vt multiplier may be utilized to couple the low voltage terminal 140 to the switch 100, and a diode may be utilized to couple the source 252 and the gate 256 of MN7.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. An analog switch comprising:
   an input voltage terminal;
   an output voltage terminal;
   a first field effect transistor (FET) having a first terminal coupled to the input voltage terminal, a second terminal coupled to a common source, and a control terminal coupled to a common gate;
   a second FET having a first terminal coupled to the output voltage terminal, a second terminal coupled to the common source, and a control terminal coupled to the common gate;
   a switched current source having an input adapted to be coupled to a voltage supply and an output coupled to the common gate;
   a third FET coupled between the common gate and a low voltage supply terminal;
   a fourth FET coupled between the common source and the low voltage supply terminal; and
   a clamp circuit having a first terminal coupled to the common gate, a second terminal coupled to the common source, and a third terminal coupled to the low voltage supply terminal.

2. The analog switch of claim 1, wherein the third FET is operable to connect the common gate to the low voltage supply terminal when the third FET is turned on and to disconnect the common gate from the low voltage supply terminal when the third FET is turned off.

3. The analog switch of claim 1, wherein the fourth FET is operable to connect the common source to the low voltage supply terminal when the fourth FET is turned on and to disconnect the common source terminal from the low voltage supply terminal when the fourth FET is turned off.

4. The analog switch of claim 1, wherein the clamp circuit is operable to clamp the voltage across the common gate and the common source.

5. The switch of claim 1, wherein the first and second FETs are n-channel field effect transistors (NFETs).

6. The switch of claim 1, wherein the third and fourth FETs are n-channel field effect transistors (NFETs).

7. The switch of claim 1, wherein the clamp circuit comprises
   an NFET having a drain coupled to the common gate, a gate coupled to the drain, and a source; and
   a source follower p-channel field effect transistor (PFET) having a source coupled to the source of the third NFET, a gate coupled to the common source, and a drain adapted to be coupled to the low voltage terminal.

8. The switch of claim 1, wherein the switched current source comprises:
   a first current mirror having a first terminal adapted to be coupled to receive an input current and a second terminal adapted to be coupled to the low voltage terminal, the first current mirror operable to provide a first mirrored current;
   a second current mirror having a first terminal coupled to the high voltage terminal and a second terminal coupled to receive the first mirrored current, the second current mirror operable to provide the gate current; and
   an NFET having a source coupled to the first current mirror, a drain coupled to the second current mirror, and a gate adapted to be coupled tor receive an enable signal, the NFET operable to couple the first current mirror to the second mirror responsive to the enable signal.

9. The switch of claim 1, wherein the clamp circuit applies approximately 2.5V between the common source and the common gate to enhance an on resistance flatness of the analog switch.

10. The switch of claim 1, wherein the clamp circuit applies less than 3.0V between the common source and the common gate to enhance the on resistance flatness of the analog switch.

11. An analog switch comprising:
    an input voltage terminal;
    an output voltage terminal;
    a first field effect transistor (FET) having a drain coupled to the input voltage terminal, a source coupled to a common source, and a gate coupled to a common gate;
    a second FET having a drain coupled to the output voltage terminal, a source coupled to the common source, and a gate coupled to the common gate;
    a switched current source having an input adapted to be coupled to a voltage supply and an output coupled to the common gate;
    a third FET having a drain coupled to the common gate, a source adapted to be coupled to a low voltage supply terminal, and a gate adapted to be coupled to receive a disable signal;
    a fourth FET having a drain coupled to the common source, a source adapted to be coupled to the low voltage supply terminal, and a gate adapted to be coupled to receive the disable signal; and
    a clamp circuit having a first terminal coupled to the common gate, a second terminal coupled to the common source, and a third terminal coupled to the low voltage supply terminal, the clamp circuit operable to clamp the voltage across the common gate and the common source.

12. The switch of claim 11, wherein the switched current source comprises:
    a fifth NFET having a drain adapted to be coupled to receive an input current, a source coupled to the low voltage supply terminal, and a gate coupled to the drain; and
    a sixth NFET having a drain, a source coupled to the low voltage supply terminal, and a gate coupled to the gate of the fifth NFET, the sixth NFET operable to mirror the input current.

13. The switch of claim 11, wherein the switched current source comprises:
- a first p-channel field effect transistor (PFET) having a source coupled to the high voltage supply terminal, a drain, and a gate coupled to the drain;
- a second PFET having a source coupled to the high voltage supply terminal, a drain coupled to the common gate, and a gate coupled to the gate of the first PFET, the second PFET operable to mirror current through the first PFET and supply the gate current to the common gate;
- a seventh NFET having a drain coupled to the drain of the first PFET, a source coupled to the drain of the sixth NFET, and a gate adapted to be coupled to receive an enable signal, the seventh NFET operable to couple the sixth NFET to the first PFET.

14. The switch of claim 11, wherein the clamp circuit comprises
- an eighth NFET having a drain coupled to the common gate, a gate coupled to the drain, and a source; and
- a source follower PFET having a source coupled to the source of the eighth NFET, a gate coupled to the common source, and a drain coupled to the low voltage terminal.

15. The switch of claim 11, further comprising a diode having anode coupled to the common source and a cathode coupled to the common gate.

16. An analog switch comprising:
- an input voltage terminal;
- an output voltage terminal;
- a first field effect transistor (FET) having a first terminal coupled to the input voltage terminal, a second terminal coupled to a common source, and a control terminal coupled to a common gate;
- a second FET having a first terminal coupled to the output voltage terminal, a second terminal coupled to the common source, and a control terminal coupled to the common gate;
- a third FET coupled between the common gate and a low voltage supply terminal;
- a fourth FET coupled between the common source and the low voltage supply terminal;
- a first current mirror having a first terminal and a second terminal coupled to the low voltage terminal, the first current mirror operable to provide a first mirrored current at a third terminal of the first current mirror;
- a second current mirror having a first terminal adapted to be coupled to a voltage supply and having a second terminal, the second current mirror operable to provide a gate current at a third terminal of the second current mirror responsive to the first mirrored current;
- a fifth FET having a first terminal coupled to the third terminal of the first current mirror, a second terminal coupled to the second terminal of the second current mirror, and a control terminal, the fifth FET operable to couple the first current mirror to the second mirror responsive to an enable signal applied to the control terminal of the fifth FET; and
- a clamp circuit having a first terminal coupled to the common gate, a second terminal coupled to the common source, and a third terminal coupled to the low voltage supply terminal.

17. The switch of claim 16, wherein the first and second FETs are n-channel field effect transistors (NFETs).

18. The switch of claim 16, wherein the third and fourth FETs are n-channel field effect transistors (NFETs).

19. The switch of claim 16, wherein the clamp circuit comprises
- an NFET having a drain coupled to the common gate, a gate coupled to the drain, and a source; and
- a source follower p-channel field effect transistor (PFET) having a source coupled to the source of the third NFET, a gate coupled to the common source, and a drain adapted to be coupled to the low voltage terminal.

* * * * *